United States Patent
Wohlrab

(10) Patent No.: US 9,319,217 B1
(45) Date of Patent: *Apr. 19, 2016

(54) NON-INTEGER OVERSAMPLED TIMING RECOVERY FOR HIGHER ORDER QUADRATURE MODULATION COMMUNICATION SYSTEMS USING QUADRATURE-PHASE SAMPLES

(71) Applicant: THE UNITED STATES OF AMERICA AS REPRESETNED BY THE SECRETARY OF THE AIR FORCE, Washington, DC (US)

(72) Inventor: Gerard Wohlrab, Rome, NY (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/525,455

(22) Filed: Oct. 28, 2014

(51) Int. Cl.
*H04L 7/00* (2006.01)
*H04L 7/033* (2006.01)
*H04L 27/34* (2006.01)
*H04L 1/20* (2006.01)
*H03L 7/08* (2006.01)
*H03L 7/093* (2006.01)
*H03L 7/091* (2006.01)
*H03L 7/107* (2006.01)
*H03M 1/66* (2006.01)
*H03M 1/12* (2006.01)

(52) U.S. Cl.
CPC ............ *H04L 7/0029* (2013.01); *H03M 1/1255* (2013.01); *H03M 1/66* (2013.01); *H04L 1/205* (2013.01); *H04L 27/3455* (2013.01)

(58) Field of Classification Search
CPC . H04L 7/0029; H04L 27/227; H04L 27/3455; H04L 7/0338; H03L 7/091; H03L 7/0998; H03M 1/1255
See application file for complete search history.

(56) References Cited

U.S. PATENT DOCUMENTS

| | | | |
|---|---|---|---|
| 6,545,532 B1 * | 4/2003 | Maalej ................ | H04L 1/0057 329/304 |
| 2002/0141482 A1 * | 10/2002 | Agami ................ | H04L 7/0029 375/147 |
| 2003/0026369 A1 * | 2/2003 | Murray et al. ............... | 375/355 |
| 2003/0221142 A1 * | 11/2003 | Kim ...................... | H04L 7/0334 714/700 |
| 2004/0145681 A1 * | 7/2004 | Jun ............................. | 348/607 |
| 2006/0176990 A1 * | 8/2006 | Oishi et al. .................. | 375/350 |
| 2008/0240221 A1 * | 10/2008 | Morris ......................... | 375/232 |
| 2011/0103527 A1 * | 5/2011 | Liu ................. | G11B 20/10009 375/341 |
| 2011/0235762 A1 * | 9/2011 | Cochran ...................... | 375/354 |

* cited by examiner

Primary Examiner — Aristocratis Fotakis
(74) Attorney, Agent, or Firm — Joseph A. Mancini

(57) ABSTRACT

Apparatus and method for performing entirely digital timing recovery for high bandwidth radio frequency communications. The received digital data source can be sampled from any (minimum 2×) non-integer oversampled transmitted data. This method re-samples the data through interpolation and phase adjustment. The output phase error adjusts the receiver's Analog-to-digital Convertor sampling clock to improve synchronization with the transmitter's Digital-to-analog Convertor clock phase, thus improving transmitted symbol recovery.

6 Claims, 6 Drawing Sheets

NON-INTEGER OVERSAMPLED TIMING RECOVERY FOR HIGHER ORDER QUADRATURE MODULATION COMMUNICATION SYSTEMS USING QUADRATURE-PHASE SAMPLES

STATEMENT OF GOVERNMENT INTEREST

The invention described herein may be manufactured and used by or for the Government for governmental purposes without the payment of any royalty thereon.

BACKGROUND OF THE INVENTION

This invention relates generally to timing recovery of higher order modulated radio frequency communications, and, more specifically, to such radio frequency communications systems wherein the digital-to-analog and analog-to-digital conversion oversampling frequencies required to properly synchronize phase becomes excessively expensive due to the bandwidth requirements associated with a radio frequency waveform or lack of frequency tunability. This invention also relates to the field of digital interpolation of non-coherent sampled signals.

The Digital-to-analog convertor (DAC) samples at a specific, typically rising, edge of a clock that is as close in phase to the modulation clock as possible. To assist in determining the phase of the clock without a known sequence (non-data aided) transmitted, communications systems typically oversample the signal and perform analog recovery loops or digital timing recovery schemes. The majority of digital timing recovery schemes require a minimum oversampling of twice (though some require 4x) the symbol rate. Furthermore, these techniques further restrict oversampling to an integer multiple. Many system requirements (desired throughput, bit error rate, bandwidth) drive derived requirements that may preclude component selection (analog filters due to pass bands, digital boards with inadequate clock frequencies, etc.). Ultimately, the choice of available hardware may prevent the transmitter-receiver pair from operating with an integer multiple sampling factor. Decimal oversampling at the transmitter would render many digital timing recovery techniques useless. In addition, many timing recovery schemes are not suited for higher order modulations, i.e. 16-Quadrature Amplitude Modulation (16-QAM), as they rely on zero crossings for phase error calculations and sampling adjustments.

An optimal solution to the timing recovery of received signals is a reconfigurable, all digital scheme capable of analyzing and adjusting incoming symbols oversampled at any decimal value at or above 2x. Feedback can be given to the Analog-to-Digital convertor's clock via a numerical controlled oscillator, but results shown for 16-QAM recovery compensate on a free-running clock without feedback. The prior art has been able to isolate each of these parameters independently, but has failed to optimize for all parameters at once without expansive processing. Specifically, the prior art still either uses analog recovery loops prone to component tolerances or complex (memory and processing intensive) interpolation and decimation schemes.

In "A BPSK/QPSK Timing-Error Detector for Sampled Receivers," a digital timing recovery scheme is proposed that has served as the basis for many digital synchronization techniques. This requires integer multiple oversampling of a Binary Phase Shift Keying or Quadrature Phase Shift Keying modulation; both of which do not apply to the problem this invention intends to solve.

In U.S. Pat. No. 5,495,203, a QAM demodulator with non-integer sampling is used to interpolate, and then decimate an incoming signal. The resampled signal is fed into a control loop to recover the data rate and continuously tunes interpolation and decimation until locked to the intended data. A limitation to this approach, potentially, is the complexity of the interpolation and decimation values to approximate oversampling rates needed.

In U.S. Pat. No. 5,878,088, a variable symbol timing recovery scheme is proposed with two stage interpolation and decimation controlled by multiplexors and based on the phase error within the control loop. This allows the system to increase or decrease the level of granularity needed to estimate the QAM symbol data and adjust a numerically controlled oscillator as needed. However, this invention may be affected by excessive delay and control overhead to synchronize the varying interpolation and decimation stages.

In U.S. Pat. No. 6,295,325, an arbitrary oversampling timing recovery loop is proposed. The invention is capable of taking any symbol data rate and oversample by an integer multiple. The flexibility of the oversampling is convenient, but a situation where the oversampling frequency is not an integer multiple of the symbol data rate is an issue.

In U.S. Pat. No. 6,854,002, an analog high speed interpolation apparatus is proposed, allowing for low latency corrections of the oversampling of a received signal within a timing recovery loop. While a promising invention, the necessity for complex and expensive analog components is a limiting factor.

In U.S. Pat. No. 7,149,265, a timing recovery loop is proposed with reconfigurable non-integer oversampling. A configurable number of parallel elements examine whether a delay is occurring from the previous sample (within the same element) and if a shift is found within that sampling cycle (element-to-element) and adjust a counter to numerically control incoming samples. This invention requires the sample rate to be a rational number p/q where the number of parallel elements, N, is an integer factor of q. This restricts the selection of p and q, thus the selection of the sampling frequency, which may be limited to the system hardware.

OBJECTS AND SUMMARY OF THE INVENTION

It is therefore an object of the present invention to provide an apparatus and method that overcomes the prior art's dependency on highly specialized and high complexity ADC and DAC component pairs and processes therein to perform up-sampling at integer multiples of the system's symbol rate to enable digital timing recovery.

It is a further object of the present invention to eliminate DAC sampling frequency configuration to properly oversample a system's symbol rate.

It is still a further object of the present invention to provide an apparatus and method wherein an entirely digital timing recovery scheme adjusts DAC sampling, eliminating phase error noise introduced by analog components.

It is yet still a further object of the present invention to provide an apparatus and method that is capable of decimal oversampling factors without extensive interpolation and decimation components or logic.

An additional object of the present invention is to provide a means to recover symbols transmitted through higher order modulations (i.e., 16-QAM).

Briefly stated, the present invention achieves these and other objects through the digital calculation of phase error from sampled data and manipulation of clock phase driving the ADC. Initially, the phase, which drives the moment when the ADC samples the incoming analog signal, will he unsynchronized with the transmitter DAC phase. As the digital timing recovery executes, the phase error (difference between the desired phase and the current sampling phase at the receiver) is calculated based on previous samples. A positive trend in symbol magnitude indicates sampling is occurring too late; therefore, the phase of the sampling clock should be shifted to the left. Conversely, a negative trend indicates sampling is occurring too early and the sampling clock phase should be shifted to the right. This process is continually updating phase as necessary to track phase drift caused by system components or environment impairments.

To achieve timing recovery within a higher order modulation system (i.e.: 16-QAM) with non-integer oversampling, an efficient calculation of the phase error must occur from a digital data source. For proper execution of this process, a precise sampling rate must be known of both the transmitter and receiver. There are no requirements on the two values, but it is recognized the exact decimal ratio may not be realizable within hardware (i.e.: a Field Programmable Gate Array). This is in contrast to the prior art, which either requires integer values and limits the system to integer oversampling or utilizes large interpolation and decimation values at the receiver to operate on a subset of non-integer oversampling scenarios. Furthermore, the majority of prior art operates within binary modulated systems. Nothing in the prior art proposes the flexibility of the present invention.

Therefore, it is accurate to say that present invention (1) can ensure recovery of a received oversampled waveform as prior art requires to achieve the same; (2) can ensure recovery of a received higher order modulated waveform as prior art requires to achieve the same; and (3) can ensure recovery of a received non-integer oversampled, higher order modulated waveform directly from ADC digital samples while reducing requirements on DAC and ADC sampling frequencies. As such, the present invention represents a significant departure from prior art methods.

According to an embodiment of the invention, apparatus for performing digital timing recovery comprises: software or an FPGA or similar parallel signal processing chip, a DAC capable of sufficiently sampling the digital data stream and an ADC capable of sufficiently sampling the received waveform.

The above and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
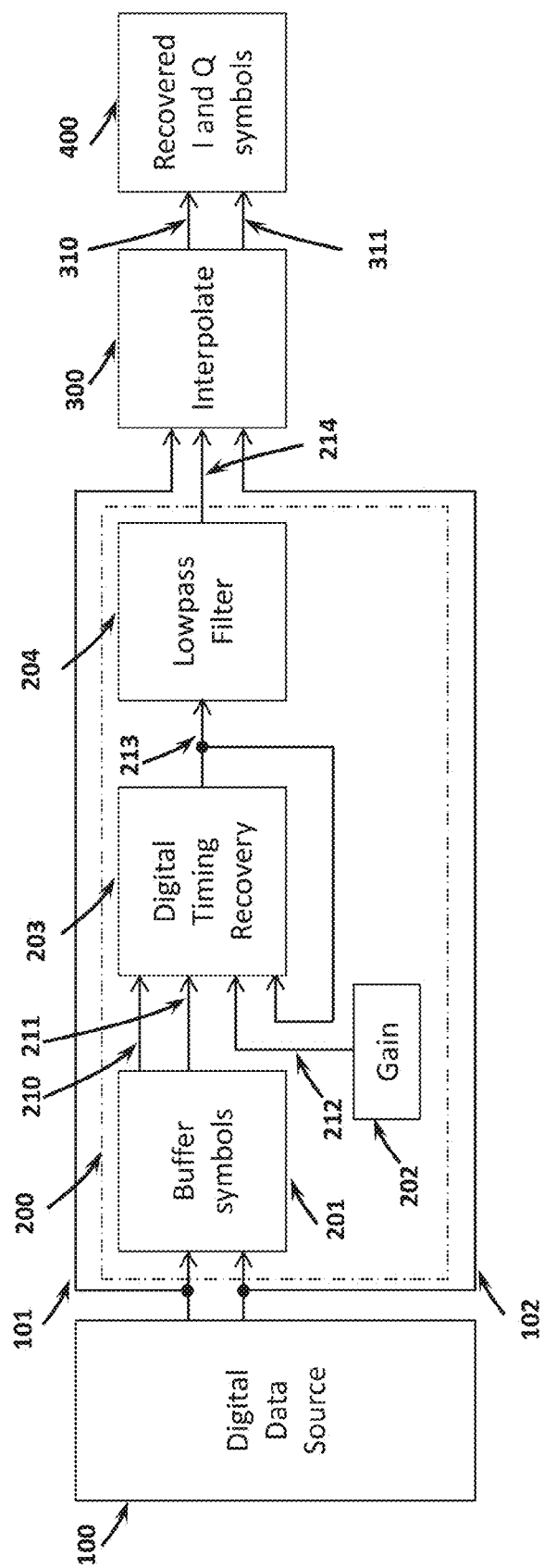
FIG. 1 is a block diagram representation of the major portions of the invention.

Referring to FIG. 1, the key components of the invention include the digital data source 100, the timing recovery system 200 and the interpolation (symbol update) 300. The digital data source is assumed to be the analog-to-digital converter sampling the radio frequency input from the receiver antenna at a sampling rate $F_{samp}$ and has no bearing on the invention. The timing recovery system is broken down further into the buffering of incoming data 201, the update gain (learning factor) 202, the timing recovery logic 203 and Lowpass filter 204.

Still referring to FIG. 1, the digital data source 100 consists of in-phase (I) and quadrature-phase (Q) components 101 and 102, respectively. These symbols are buffered a minimum [N] samples, where $$N = \frac{F_{samp}}{F_{sym}}$$

and $F_{sym}$ is the system symbol rate. The buffered arrays for I 210 and Q 211 are inputs to the timing recovery logic 203 as well as the update gain 202 and phase error 213. The output of the timing recovery logic is the phase error 213, which is filtered by a Lowpass filter 204 to remove extremes in phase variability. This value is fed into the interpolation block 300 where incoming I 101 and Q 102 values are recalculated. The updated values at 310 and at 311 are the recovered I and Q symbols, respectively. These are further processed as needed in 400 in standard digital communications processes not discussed in this invention.

Figure 2:
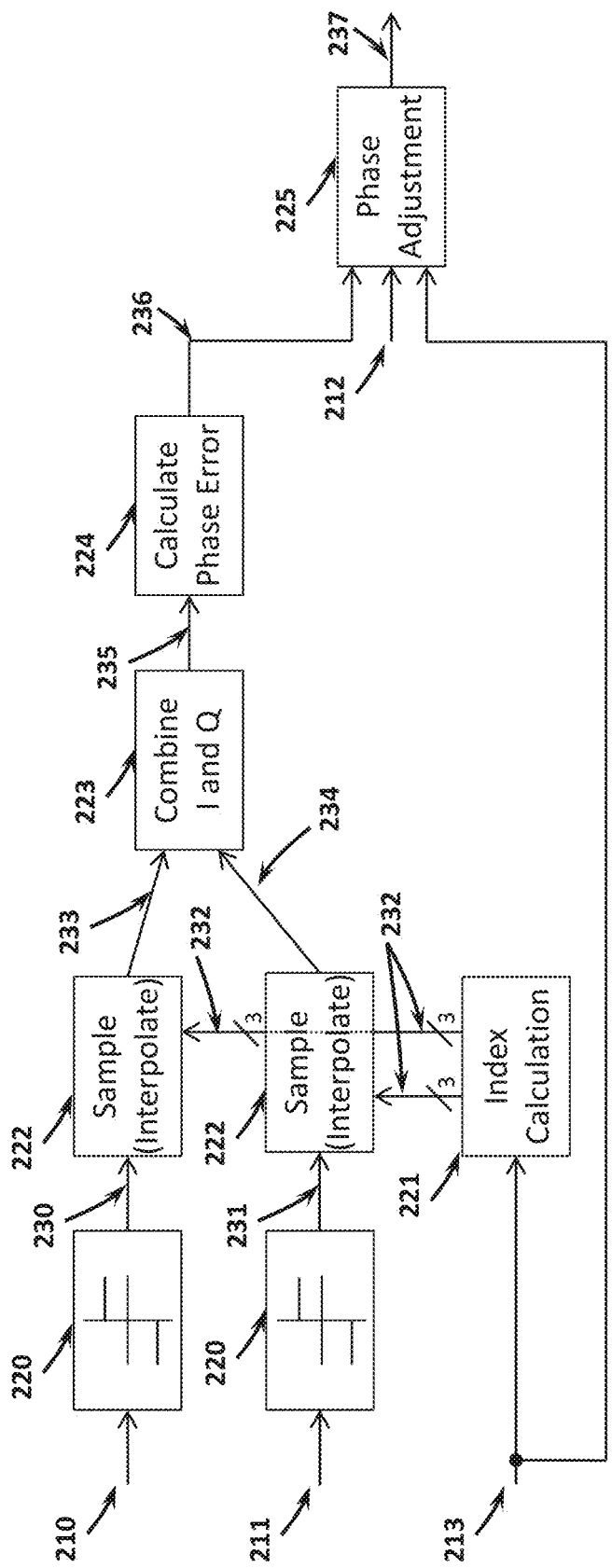
FIG. 2 is a block diagram representation of the timing recovery scheme whereby in-phase and quadrature-phase samples are used for error detection.

Referring to FIG. 2, which describes the timing recovery logic, the buffered I 210 and Q 211 samples are evaluated by the signum function 220 such that:

$$s(x) = \begin{cases} 1, & \text{if } x > 0 \\ -1, & \text{if } x < 0 \\ 0, & \text{if } x = 0 \end{cases}$$

This results in arrays being output at 230 and at 231, respectively. The previously calculated phase error 213 is fed into the index calculation logic 221 to determine the sampling indices for the start ($t_s$), center ($t_c$) and end ($t_e$) of the incoming symbol within the arrays at 230 and at 231. The indices are calculated as follows:

$$t_c = 1 + k \cdot N + \frac{N}{2} + \phi_0$$

$$t_s = t_c - \frac{N}{2}$$

$$t_e = t_c + \frac{N}{2}$$

where k is a counter of which symbol is being sampled within the buffer and $\Phi_0$ is the previous symbol phase error present at 213. The three real-valued numbers calculated within index calculation logic 221 form array at 232 which are fed into sampling blocks 222. Here, the arrays at 230 and at 231 are interpolated and sampled (approximately) at sampled indices—to the best ability of the host hardware—to form I 233 and Q 234 samples respectively. Each of the I and Q samples are combined in 223 to form a three element complex array output at 235 consisting of start ($x_s$), center ($x_c$) and end ($x_e$) symbols defined as:

$$x_s = x_I(t_s) + jx_Q(t_s)$$

$$x_c = x_I(t_c) + jx_Q(t_c)$$

$$x_e = x_I(t_e) + jx_Q(t_e).$$

Still referring to FIG. 2, the three element complex array output at 235 of the I-Q combiner 223 is fed into the phase error calculator 224 to determine the amount and direction (early or late) of phase offset within this sampling iteration. The current phase offset output at 236 is calculated by:

$$\Delta_\Phi = \Re\{x_e - x_s\} * \overline{x}_c$$

where $\Re\{\cdot\}$ is the real portion of a complex number and $\overline{\cdot}$ is the complex conjugate. Finally, the previous phase offset at 213, current phase offset at 236 and update gain at 212 are fed into the phase adjustment block 225. If the difference between previous phase offset at 213 and current phase offset at 236 is above a system defined threshold T, the phase adjustment at 213 is adjusted accordingly to yield an output at 237, i.e.:

adjusted phase offset 237 =

$$\begin{cases} \text{previous phase offset 213 + update gain 212,} \\ \quad \text{if current phase offset 236} < -T \\ \text{previous phase offset 213 - update gain 212,} \\ \quad \text{if current phase offset 236} > T \\ \text{previous phase offset 213, if |current phase offset 236|} < T \end{cases}$$

The output of this calculation becomes the new previous phase offset 213 value identified in FIG. 1, FIG. 2, FIG. 3 and FIG. 4 for the next incoming symbol.

Figure 3:
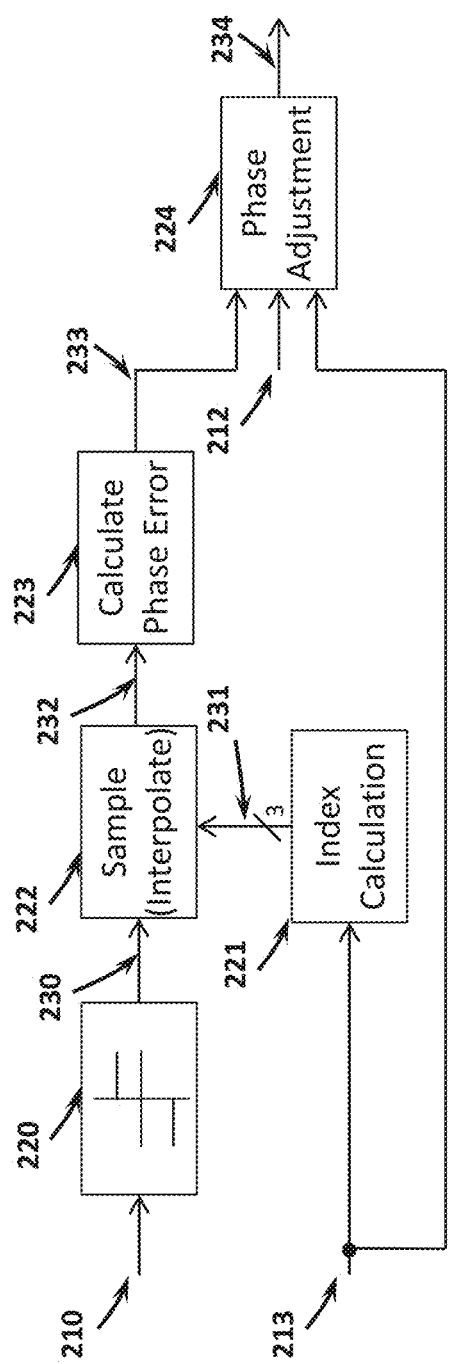
FIG. 3 is block diagram representation of the timing recovery scheme whereby in-phase samples are used for error detection.
Figure 4:
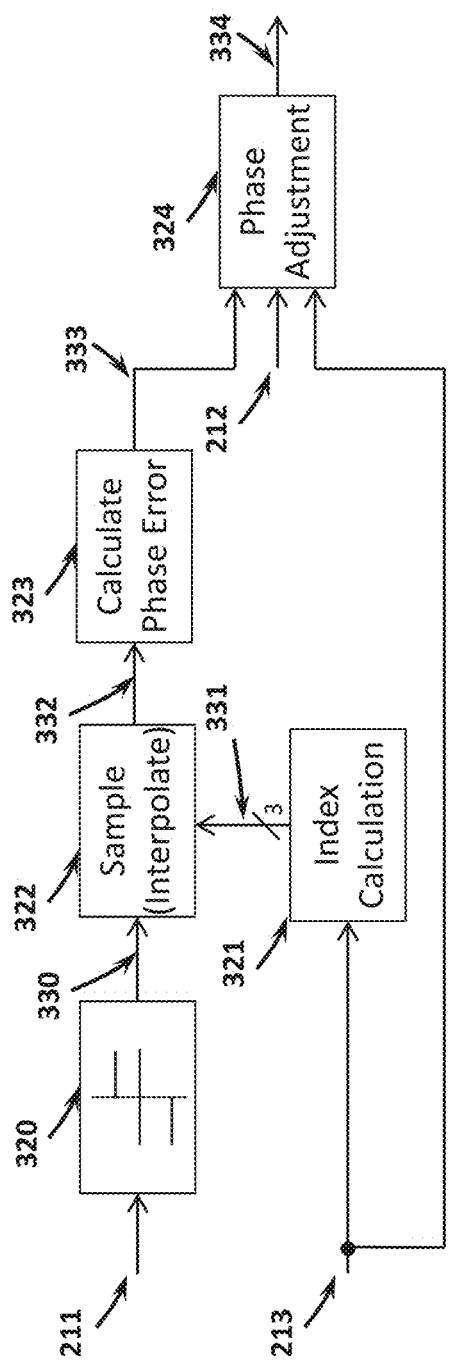
FIG. 4 is block diagram representation of the timing recovery scheme whereby quadrature-phase samples are used for error detection.

If hardware resources cannot be given to complete the calculations within FIG. 2, a simplified process that requires calculations within I samples or Q samples can be implemented, demonstrated within FIG. 3 and FIG. 4, respectively. There is a potential penalty in tracking latency, which results in higher Error Vector Magnitude (EVM) values when utilizing only I or Q samples. An example test shown in FIG. 6 demonstrates no negative effects on EVM for N=2 oversampled system.

Referring to FIG. 3, which describes the timing recovery logic, the buffered I 210 samples are evaluated by the signum function 220 such that:

$$s(x) = \begin{cases} 1, & \text{if } x > 0 \\ -1, & \text{if } x < 0 \\ 0, & \text{if } x = 0 \end{cases}$$

This results in an array at 230. The previously calculated phase offset at 213 is fed into the index calculation logic 221 to determine the sampling indices for the start ($t_s$), center ($t_c$) and end ($t_e$) of the incoming symbol within the array at 230. The indices are calculated as follows:

$$t_c = 1 + k \cdot N + \frac{N}{2} + \phi_0$$

$$t_s = t_c - \frac{N}{2}$$

$$t_e = t_c + \frac{N}{2}$$

where k is a counter of which symbol is being sampled within the buffer and $\Phi_0$ is the previous symbol phase offset at 213. The three real-valued numbers calculated within 221 from the array at 231 which are fed into sampling block 222. Here, the array at 230 is interpolated and sampled (approximately) at sampled indices—to the best ability of the host hardware—to form a three element real-valued array of I samples at 232 consisting of start ($x_s$), center ($x_c$) and end ($x_e$) symbols defined as:

$$x_s = x_I(t_s)$$

$$x_c = x_I(t_c)$$

$$x_e = x_I(t_e).$$

Still referring to FIG. 3, the output of the sampler 232 is fed into the phase error calculator 223 to determine the amount and direction (early or late) of phase offset within this sampling iteration. The phase error at 233 is calculated by:

$$\Delta_\Phi = (x_e - x_s) \cdot (x_c - \Delta_x)$$

$$\Delta_x = \frac{x_e - x_s}{2}$$

Finally, the previous phase offset at 213, current phase offset at 233 and update gain at 212 are fed into the phase adjustment block 224. If the difference between the previous phase offset at 213 and the current phase offset at 233 is above a system defined threshold T, the phase offset at 213 is adjusted accordingly to yield a new phase offset at 234, i.e.:

adjusted phase offset 234 =

$$\begin{cases} \text{previous phase offset 213 + update gain 212,} \\ \quad \text{if current phase offset 233} < -T \\ \text{previous phase offset 213 - update gain 212,} \\ \quad \text{if current phase offset 233} > T \\ \text{previous phase offset 213, if |current phase offset 233|} < T \end{cases}$$

The output of this calculation becomes the new phase offset at 213 value identified in FIG. 1, FIG. 2, FIG. 3 and FIG. 4 for the next incoming symbol.

Referring to FIG. 4, which describes the timing recovery logic, the buffered Q 211 samples are evaluated by the signum function 320 such that:

$$s(x) = \begin{cases} 1, & \text{if } x > 0 \\ -1, & \text{if } x < 0 \\ 0, & \text{if } x = 0 \end{cases}$$

This results in an array at 330. The previously calculated phase error at 213 is fed into the index calculation logic 321 to determine the sampling indices for the start ($t_s$), center ($t_c$) and end ($t_e$) of the incoming symbol within an array at 330. The indices are calculated as follows:

$$t_c = 1 + k \cdot N + \frac{N}{2} + \phi_0$$

$$t_s = t_c - \frac{N}{2}$$

$$t_e = t_c + \frac{N}{2}$$

where k is a counter of which symbol is being sampled within the buffer and $\Phi_0$ is the previous phase offset at 213. The three real-valued numbers calculated within index calculation 321 form an array at 331 which are fed into sampling block 322. Here, the array at 330 is interpolated and sampled (approximately) at sampled indices—to the best ability of the host hardware—to form a three element real-valued array of Q samples at 332 consisting of start ($x_s$), center ($x_c$) and end ($x_e$) symbols defined as:

$$x_s = x_Q(t_s)$$

$$x_c = x_Q(t_c)$$

$$x_e = x_Q(t_e).$$

Still referring to FIG. 4, the output of the sampler 332 is fed into the phase error calculator 323 to determine the amount and direction (early or late) of phase offset within this sampling iteration. The phase error at 333 is calculated by:

$$\Delta_\Phi = (x_e - x_s) \cdot (x_c - \Delta_x)$$

$$\Delta_x = \frac{x_e - x_s}{2}$$

Finally, the previous phase offset at 213, current phase offset at 333 and update gain at 212 are fed into the phase adjustment block 324. If the difference between the previous phase offset at 213 and the current phase offset at 333 is above a system defined threshold T, the previous phase offset at 213 is adjusted accordingly to yield a new phase offset at 334, i.e.:

adjusted phase offset 334 =

$$\begin{cases} \text{previous phase offset 213 +} & \text{if current phase offset 333} < -T \\ \text{update gain 212,} \\ \text{previous phase offset 213 -} & \text{if current phase offset 333} < T \\ \text{update gain 212,} \\ \text{previous phase offset 213,} & \text{if |current phase offset 333|} < T \end{cases}$$

The output of this calculation becomes the new phase offset 213 value identified in FIG. 1, FIG. 2, FIG. 3 and FIG. 4 for the next incoming symbol.

Figure 5:
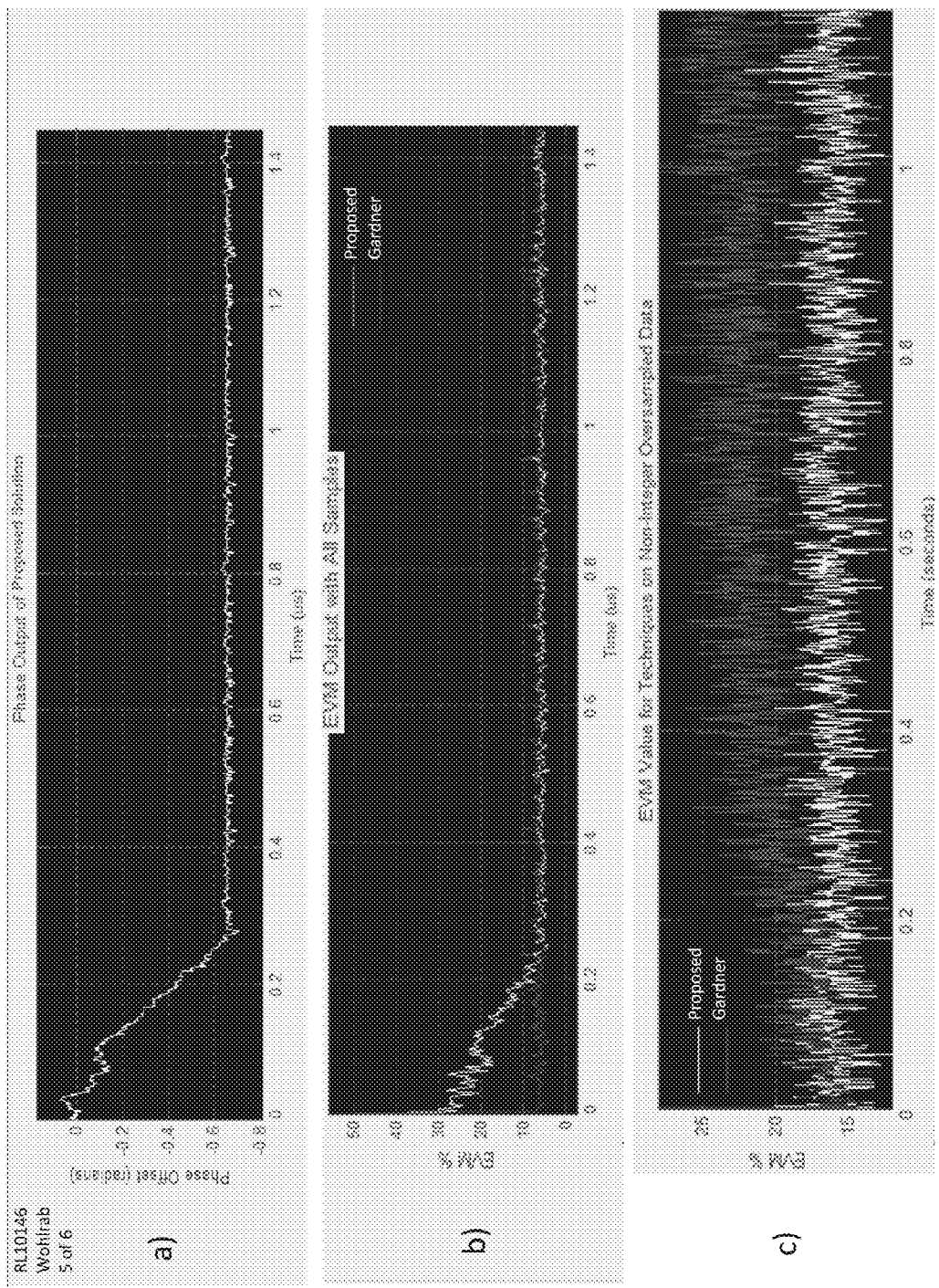
FIG. 5 is a representation of (a) the phase error tracking of the system, (b) comparing the instantaneous Error Vector Magnitude (EVM) of corrected samples for the proposed solution and prior art (Gardner) for an integer oversampled case and (c) comparing the instantaneous Error Vector Magnitude (EVM) of corrected samples for the proposed solution and prior art (Gardner) for a non-integer oversampled case.

Referring to FIG. 5, plot a) displays an example test run of proposed solution tracking an approximate $$\frac{\pi}{5}$$

receiver phase offset. For comparison, plot b) displays the EVM output of the proposed solution (lighter line) and a typical Gardner implementation (darker line) for the same receiver phase offset. Plot c) showcases the ability of the proposed solution to successfully track an $$\frac{5}{1.412} \approx 3.54$$

oversampled signal without losing lock.

Figure 6:
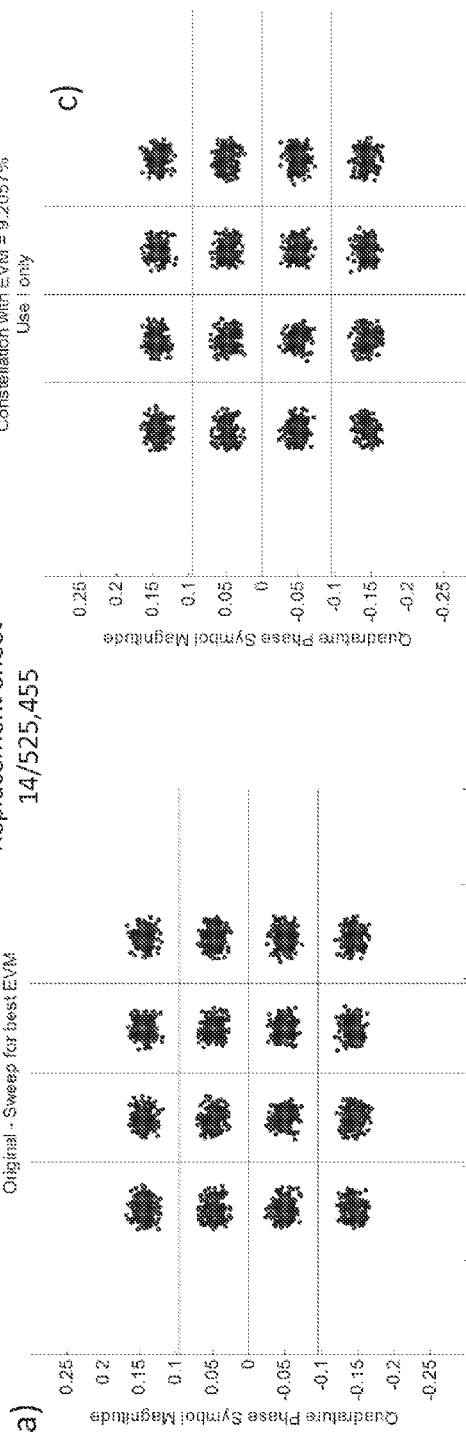
FIG. 6 is a comparison of output EVM for perfect synchronization, utilizing in-phase and quadrature-phase samples for proposed phase error calculation (FIG. 2), utilizing in-phase samples only for proposed phase error calculation (FIG. 3) and utilizing quadrature-phase samples only for proposed phase error calculation phase error calculation (FIG. 4).
Figure 6:
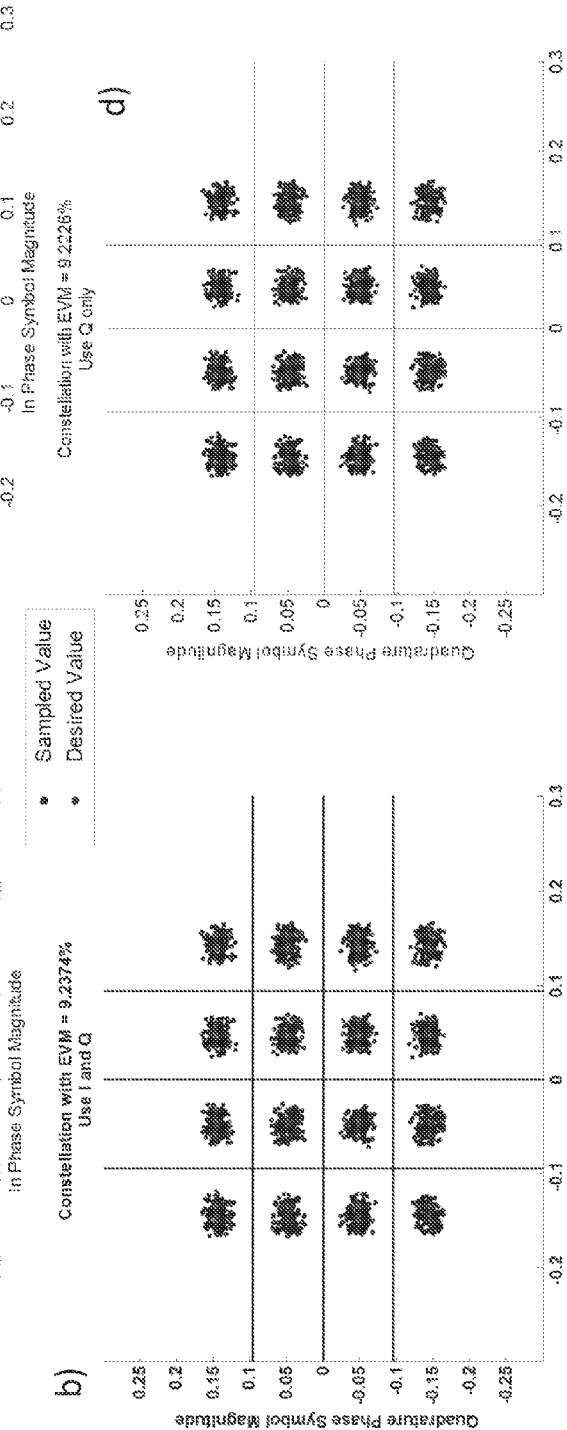

Referring to FIG. 6, the four constellation plots represent the received symbol values in terms of I and Q amplitudes. The lighter dots indicated the desired symbol locations for perfect symbol recovery. The darker dots are the values with the respective recovery scheme. In a), the best (genie) sample location was selected to minimize EVM the best for the incoming data; in b) the proposed method for timing recovery utilizing I and Q samples together is given; in c) and d), the proposed method for timing recovery utilizing I samples only and Q samples only, respectively is given. In this case, no penalty is realized for utilizing the real or imaginary samples exclusively.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An apparatus for timing recovery in digital communications, comprising:
 a timing recovery subsystem into which quadrature-phase components of a digitized communications signal are input and a phase adjustment signal is output; and
 an interpolation subsystem into which said phase adjustment signal and said quadrature-phase components are input and recovered in-phase and quadrature-phase symbols are output;
 wherein said timing recovery subsystem further comprises:
  a buffer into which said quadrature-phase components of said digitized communications signal are input;
  a gain block outputting an update gain signal;
  timing recovery logic, output of which is a phase offset signal, and into which is input:
   an array of buffered quadrature-phase components;
   said update gain signal; and
   a feedback sample of said phase offset signal; and
  a lowpass filter for removing phase variability extremes in said phase offset signal; and
 wherein said timing recovery logic further comprises:
  a signum function calculator into which said array of buffered quadrature-phase components is input;
  a first sampler into which an output of said signum function calculator is input;
  an index calculator having as an input a previous iteration phase offset signal and having as an output sampling indices being input into said sampler;
  a phase error calculator having as an input a real-valued array output from said sampler and having as an output an amount of and direction of current iteration phase offset within a particular sampling iteration; and
  a phase adjustment block having as inputs said update gain signal, said current iteration phase offset, and said previous iteration phase offset signal and having as an output an adjusted phase offset signal; and
  wherein said buffer samples said quadrature-phase components a minimum of N samples, wherein $$N = \left\lceil \frac{F_{samp}}{F_{sym}} \right\rceil;$$

where
 $F_{sym}$ is the symbol rate; and
 $F_{samp}$ is the sample rate; and
 wherein said index calculator computes said sampling indices according to:

$$t_c = 1 + k \cdot N + \frac{N}{2} + \phi_0$$

$$t_s = t_c - \frac{N}{2}$$

$$t_e = t_c + \frac{N}{2}$$

wherein
 $t_s$ is the start of the incoming symbol within said array;
 $t_c$ is the center of the incoming symbol within said array;
 $t_e$ is the end of the incoming symbol within said array;
 k is a counter of which symbol is being sampled within said buffer; and
 $\Phi_0$ is the previous symbol phase offset.

2. The apparatus of claim 1, wherein said real-valued array further comprises start ($x_s$), center ($x_c$) and end ($x_e$) symbols defined as:

$$x_s = x_I(t_s)$$

$$x_c = x_I(t_c)$$

$$x_e = x_I(t_e).$$

3. The apparatus of claim 2, wherein said current phase offset $\Delta_\Phi$ is defined as:

$$\Delta_\Phi = (x_e - x_s) \cdot (x_c - \Delta_x)$$

where $$\Delta_x = \frac{x_e - x_s}{2}.$$

4. A method for timing recovery in a digital communications signal having in-phase and quadrature components, comprising the steps of:
 buffering the quadrature-phase components of the digitized communications signal;
 recovering timing of said quadrature-phase components so as to generate a phase adjustment signal;
 lowpass filtering said phase adjustment signal so as to remove phase variability extremes therefrom; and
 interpolating between said filtered phase adjustment signal and said in-phase and quadrature components so as to recover quadrature-phase symbols;
 wherein said step of recovering the timing of said quadrature-phase components further comprises the steps of:
  performing a signum function on said buffered quadrature-phase components;
  sampling said signed and buffered quadrature-phase components to form a complex array comprising start ($x_s$), center ($x_c$) and end ($x_e$) symbols; determining sampling indices from a previous phase adjustment signal;
  performing a phase offset calculation on said complex array so as to determine an amount and direction of the current phase offset within a sampling iteration; and
  generating an adjusted phase offset signal as a function of a gain signal, said current phase offset, and said previous phase adjustment signal;
 wherein said step of sampling further comprises sampling a minimum of N samples, wherein $$N = \left\lceil \frac{F_{samp}}{F_{sym}} \right\rceil;$$

where
$F_{sym}$ is the symbol rate; and
$F_{samp}$ is the sample rate; and
wherein said step of determining said sampling indices further comprises the steps of computing said sampling indices according to:

$$t_c = 1 + k \cdot N + \frac{N}{2} + \phi_0$$

$$t_s = t_c - \frac{N}{2}$$

$$t_e = t_c + \frac{N}{2}$$

wherein
$t_s$ is the start of the incoming symbol within said array;
$t_c$ is the center of the incoming symbol within said array;
$t_e$ is the end of the incoming symbol within said array;
k is a counter of which symbol is being sampled within said buffer; and $\Phi_0$ is the previous symbol phase offset.

5. The method of claim 4, wherein said step of forming a complex array further comprises the step of determining said start ($x_s$), center ($x_c$) and end ($x_e$) symbols according to:

$$x_s = x_I(t_s)$$

$$x_c = x_I(t_c)$$

$$x_e = x_I(t_e).$$

6. The method of claim 5, further comprising the step of computing said current phase offset $\Delta_\Phi$ according to:

$$\Delta_\Phi = (x_e - x_s) \cdot (x_c - \Delta_x)$$

where $$\Delta_x = \frac{x_e - x_s}{2}.$$

* * * * *